US006625227B1

(12) United States Patent
Shull et al.

(10) Patent No.: US 6,625,227 B1
(45) Date of Patent: Sep. 23, 2003

(54) ARTIFICIAL RAMPING OF TRANSMIT POWER FOR BURST TRANSMISSIONS

(75) Inventors: Eric A. Shull, Raleigh, NC (US); Robert A. Zak, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/409,505

(22) Filed: Sep. 30, 1999

(51) Int. Cl.[7] ................................................ H04B 1/04
(52) U.S. Cl. ........................................................ 375/295
(58) Field of Search ................................. 375/135, 146, 375/295, 296, 297; 332/103; 455/127, 126

(56) References Cited

U.S. PATENT DOCUMENTS

| | | | | |
|---|---|---|---|---|
| 5,282,226 A | * | 1/1994 | Critchlow | 375/59 |
| 5,369,789 A | * | 11/1994 | Kosugi et al. | 455/126 |
| 5,697,073 A | | 12/1997 | Daniel et al. | 455/126 |
| 6,477,358 B1 | * | 11/2002 | Mader et al. | 455/91 |

FOREIGN PATENT DOCUMENTS

| | | | |
|---|---|---|---|
| EP | 0614269 A1 | 9/1989 | H03G/3/20 |
| EP | 0538870 A2 | 10/1992 | H04B/7/005 |
| EP | 0631398 A2 | 6/1994 | H04B/7/005 |

* cited by examiner

Primary Examiner—Don N. Vo
Assistant Examiner—Dung X. Nguyen
(74) Attorney, Agent, or Firm—Coats & Bennett, P.L.L.C.

(57) ABSTRACT

An artificial ramping waveform profile is applied to a burst transmission power amplifier in order to reduce transients. A profile source is supplied with a plurality of pre-determined artificial ramping profiles. At the beginning of the burst transmission ramping period, one of the artificial ramping profiles is selected and fed to the power amplifier. The selection of the artificial ramping profile is based at least in part on the first message symbol of the message to be burst transmitted. Preferably, each different possible first message symbol has its own unique corresponding artificial ramping profile, and the corresponding waveform is used to artificially ramp the power amplifier when that message symbol is the first message symbol. At the end of the ramping period, the inputs to the power amplifier are switched to the traditional signal source, such as the FIR filters, etc., for receipt of the message symbols. The transmitted signal is based then on the response of the power amplifier to the artificial ramping profile and the message symbols. The generation of transient adjacent channel power is significantly reduced by artificially ramping the power amplifier rather than allowing for natural ramping. By choosing the artificial ramping profile based on the first message symbol, the phase trajectory changes near the end of the ramping period may be significantly smoothed, thereby lessening the generation of undesired harmonic power levels.

20 Claims, 6 Drawing Sheets

(a)

(b)

ARTIFICIAL RAMPING OF TRANSMIT POWER FOR BURST TRANSMISSIONS

BACKGROUND OF THE INVENTION

The present invention relates to the field of radiowave burst transmissions, and more particularly to a method of ramping transmission power in wireless communications devices using burst transmission.

Wireless communications devices using burst transmission, such as time-division multiplexed cellular telephones, transmit during prescribed time-slots. The transmissions in most systems must be within a relatively narrow frequency range, sometimes referred to as a frequency channel. In order to avoid interference, these devices are required to limit their transmission power in nearby frequency channels. Under steady state conditions, this may be achieved using known techniques. However, a non-trivial portion of the burst transmission may not be under steady state conditions. Indeed, it is common for battery powered burst transmitters to power their transmitters only during the appropriate time slots, and to power their transmitters during other time slots. Thus, in order to transmit during the transmit time-slot, the transmitter must be changed from a low (or off) power level to the desired transmit power level. Likewise, the transmitter must be returned to the low power level near the end of the transmit time slot.

In most applications, this changing of the transmit power level must be accomplished very rapidly due to the short duration of the time-slots. However, rapid changes in transmit power levels tend to generate undesirable transient harmonics which cause transmit power leakage into nearby frequency channels. In the terminology of ANSI-136, this means that quick transmit level changes leads to undesirably large transient adjacent channel power levels.

In the prior art, two main approaches have been taken to limit transient adjacent channel power in burst transmission wireless communications devices. Both methods are responsive to the design pressures present in battery powered wireless communications devices, including: 1) the power amplifiers used should operate at a point of high-efficiency; 2) the transmit modulator and other circuitry must consume as little power as possible; and 3) the complexity of all circuitry should be minimized to reduce cost. The first approach uses Finite Impulse Response (FIR) filters that are designed to reach peak output after a period of time that corresponds to the allowed ramping period for transmit power. At the start of each transmit burst, the FIR filters are reset and allowed to ramp-up naturally, typically resulting in a raised-root cosine response. It should be noted that the raised-root cosine impulse response may be specified by the relevant communication standard, such as ANSI-136, and other communications systems may use other low-pass impulse responses. The second approach relies on forced linear ramping using gain control of the power amplifier or the RF modulator. This linear ramping gain control requires additional complexity and may actually increase transient adjacent channel power due to signal discontinuities.

Thus, there remains a need for an improved transmit power ramping method for burst transmissions. Such a method should reduce adjacent channel power without requiring complex circuitry or high power drain.

SUMMARY OF THE INVENTION

The present invention applies an artificial ramping waveform profile to the power amplifier in order to reduce transients. An artificial ramping profile source is supplied with a plurality of pre-determined artificial ramping profiles. At the beginning of the ramping period, one of the artificial ramping profiles is selected and fed from the artificial ramping profile source to the power amplifier. The selection of the artificial ramping profile is based at least in part on the first message symbol of the message to be burst transmitted. Preferably, each different possible first message symbol has its own unique corresponding artificial ramping profile, and the corresponding waveform is used to artificially ramp the power amplifier. For instance, if the first message symbol is Type X, then corresponding artificial ramping profile X is selected; if the first message symbol is Type Y, then artificial ramping profile Y is selected, and so forth. At the end of the ramping period, the inputs to the power amplifier are switched to the traditional signal source, such as the FIR filters, etc., for receipt of the message symbols. The transmitted signal is based then on the response of the power amplifier to the artificial ramping profile and the message symbols.

In some embodiments, the selection of the artificial ramping profile is not based only on the first message symbol to be transmitted, but also on the next message symbol, or on the next several symbols.

The generation of transient adjacent channel power may be significantly reduced by artificially ramping the power amplifier rather than allowing for natural ramping of the power amplifier. By choosing the artificial ramping profile based on the first message symbol, the phase trajectory changes near the end of the ramping period may be significantly smoothed, thereby lessening the generation of undesired harmonic power levels. Further, this may be accomplished with reduced bias current in the power amplifier, thereby saving battery power, and without the additional circuit complexity associated with forced linear ramping.

DETAILED DESCRIPTION

Figure 1:
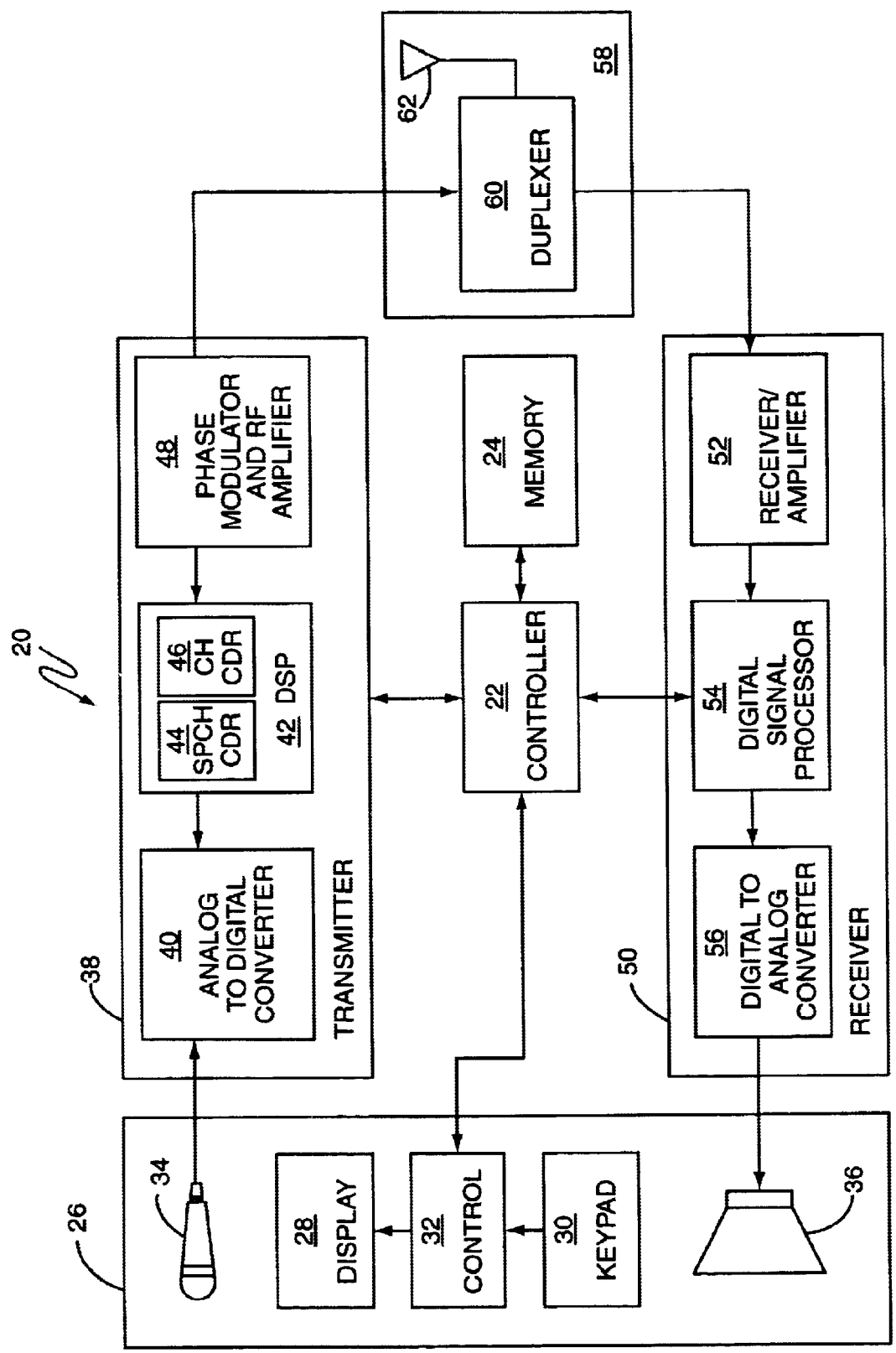
FIG. 1 is a schematic of a typical cellular telephone wireless communications device using burst transmission.

For clarity of illustration, a cellular telephone capable of transmitting and receiving digital signals will be used as an example of a wireless communications device 20 in the following discussion, but the invention is not so limited. Indeed, the present invention may apply to any wireless communications device 20, including cellular telephones, personal communications assistants, and so forth, whether using analog or digital communications, that communicate with burst transmissions.

The cellular telephone 20 typically includes a controller 22, an operator interface 26, a transmitter 38, a receiver 50, and an antenna assembly 58. The operator interface 26 typically includes a display 28, keypad 30, control unit 32, microphone 34, and a speaker 36. The display 28 allows the operator to see dialed digits, call status, and other service information. The keypad 30 allows the operator to dial numbers, enter commands, and select options. The control unit 32 interfaces the display 28 and keypad 30 with the controller 22. The microphone 34 receives acoustic signals from the user and converts the acoustic signals to an analog electrical signal. Speaker 36 converts analog electrical signals from the receiver 50 to acoustic signals which can be heard by the user.

The analog electrical signal from the microphone 34 is supplied to the transmitter 38. The transmitter 38 includes an analog to digital converter 40, a digital signal processor 42, and a phase modulator and RF amplifier 48. The analog to digital converter 40 changes the analog electrical signal from the microphone 34 into a digital signal. The digital signal is passed to the digital signal processor (DSP) 42, which contains a speech coder 44 and channel coder 46. The speech coder 44 compresses the digital signal and the channel coder 46 inserts error detection, error correction and signaling information. The DSP 42 may include, or may work in conjunction with, a DTMF tone generator (not shown). The compressed and encoded signal from the digital signal processor 42 is passed to the phase modulator and RF amplifier 48, which are shown as a combined unit in FIG. 1. The modulator converts the signal to a form, which is suitable for transmission on an RF carrier. The RF amplifier then boosts the output of the modulator for transmission via the antenna assembly 58.

The receiver 50 includes a receiver/amplifier 52, digital signal processor 54, and a digital to analog converter 56. Signals received by the antenna assembly 58 are passed to the receiver/amplifier 52, which shifts the frequency spectrum, converts the RF signal to digital form, and boosts the low-level RF signal to a level appropriate for input to the digital signal processor 54.

The digital signal processor 54 typically includes an equalizer to compensate for phase and amplitude distortions in the channel corrupted signal, a demodulator for extracting bit sequences from the received signal, and a detector for determining transmitted bits based on the extracted sequences. A channel decoder detects and corrects channel errors in the received signal. The channel decoder also includes logic for separating control and signaling data from speech data. Control and signaling data is passed to the controller 22. Speech data is processed by a speech decoder and passed to the digital to analog converter 56. The digital signal processor 54, may include, or may work in conjunction with, a DTMF tone detector (not shown). The digital to analog converter 56 converts the speech data into an analog signal which is applied to the speaker 36 to generate acoustic signals which can be heard by the user.

The antenna assembly 58 is connected to the RF amplifier of the transmitter 38 and to the receiver/amplifier 52 of the receiver 50. The antenna assembly 58 typically includes a duplexer 60 and an antenna 62. The duplexer 60 permits full duplex communications over the antenna 62.

The controller 22 coordinates the operation of the transmitter 38 and the receiver 50, and may for instance take the form of a common microprocessor. This coordination includes power control, channel selection, timing, as well as a host of other functions. The controller 22 inserts signaling messages into the transmitted signals and extracts signaling messages from the received signals. The controller 22 responds to any base station commands contained in the signaling messages, and implements those commands. When the user enters commands via the keypad 30, the commands are transferred to the controller 22 for action. Memory 24 stores and supplies information at the direction of the controller 22 and preferably includes both volatile and non-volatile portions.

Figure 2:
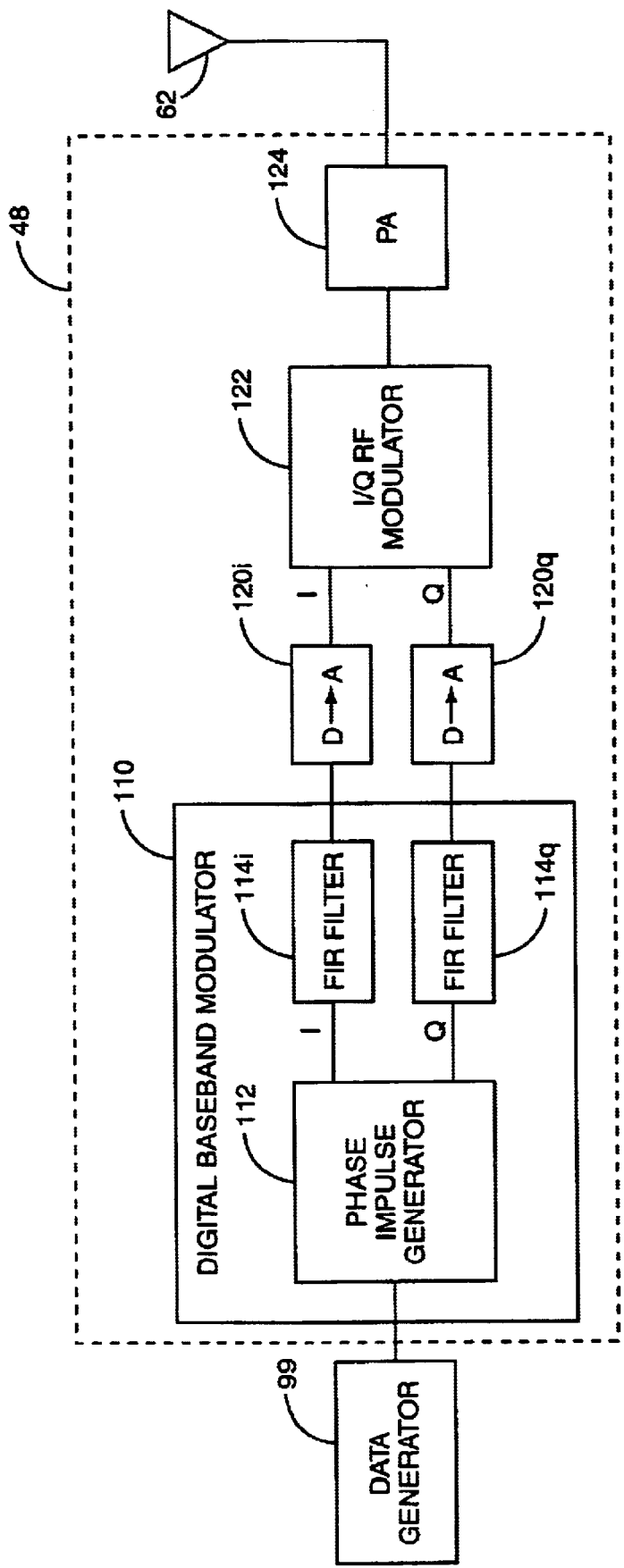
FIG. 2 is a more detailed schematic of a portion of the transmit circuitry of FIG. 1.

A phase modulator and RF amplifier 48 of the prior art is shown in greater detail in FIG. 2. In this figure, the input to the phase modulator and RF amplifier 48 is simplified to be from a data generator 99, such as the DSP 42. The input is received by a digital baseband modulator 110a. The baseband modulator 110a includes a phase impulse generator 112 and a pair of finite impulse response (FIR) filters 114$i$,114$q$. The phase impulse generator 112 translates the sequence of symbol codes from the data generator 99 into phase impulses represented by "I" and "Q" amplitude samples. The I and Q samples are applied to the respective FIR filters 114$i$,114$q$ which typically have a root-raised cosine response as specified in ANSI-136. The baseband modulator 110a outputs two signals, corresponding to I and Q, that are fed to the respective digital to analog (D/A) converters 120$i$,120$q$. The output from the D/A converters 120$i$,120$q$ are fed into an I/Q RF modulator 122 for frequency modulation to the appropriate radio frequency channel. The resulting signal is amplified by a power amplifier 124 and transmitted via the antenna 62. Overall, the operation of this phase modulator and RF amplifier 48 is well known in the art, and further discussion is not necessary for understanding of the present invention.

Figure 3:
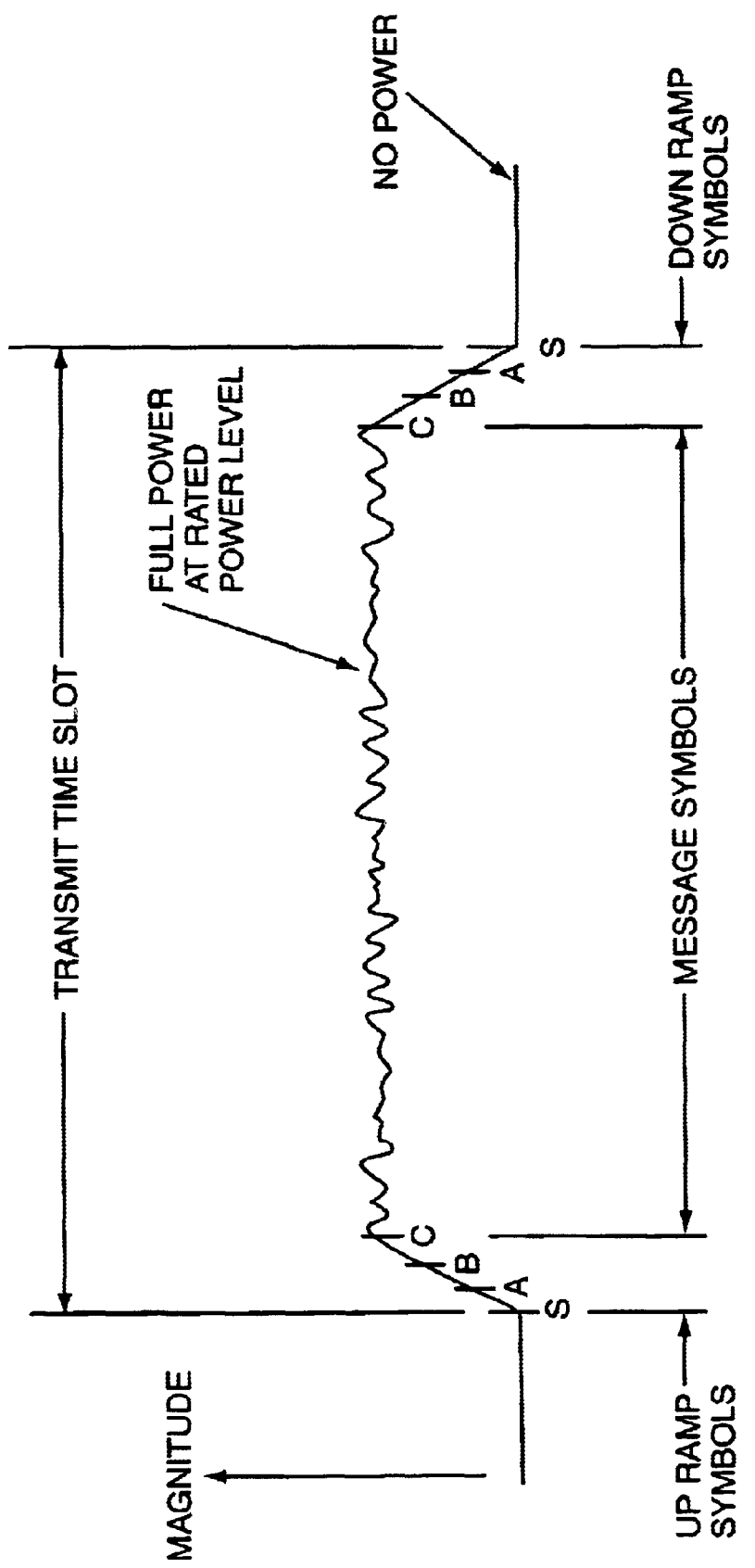
FIG. 3 is a time versus magnitude diagram of the transmit power for a burst transmission.

The transmitted burst transmission signal typically takes the form shown in FIG. 3. The phone 20 transmits during certain time-slots and not during others. The burst transmission during the time slot begins with a ramp up of transmit power. For ANSI-136 systems, this ramp up period corresponds to three symbol periods, or 123.6 $\mu$s. The start of the time slot is shown by S; the first two symbols transmitted during ramp-up are represented by A and B. The ramp up period ends with the transmission of a reference symbol (C), with both I equal to one and Q equal to zero. See FIG. 4. During the ramp up period, the total transmit power is increasing. That is, the square root of the sum of the squares of I and Q is increasing. After the reference symbol C, the message symbols are transmitted. When the message symbols are transmitted, the I and Q values vary, thereby conveying the information to be transmitted. For instance, the symbols may be phase shift keyed, such as by Differential Quaternary Phase Shift Keying (DQPSK). At the conclusion of the message symbols, the transmit power returns to a low or no power state, typically by ramping down as shown. During time slots other than the transmit time slot, the power amplifier 124 is preferably outputting zero power.

Obviously, the transmit power varies over time. However, the differences during the transmission of the message symbols is typically much less than the difference between the low/off state and the average power during transmission of the message symbols. Stated another way, the ramp up variations are much larger than the relatively constant core portion of the transmission. For instance, the typical power variation during the transmission of the message symbols is relatively small, such as 3 dB, while the ramp up power level change may be 85 dB or more.

Figure 4:
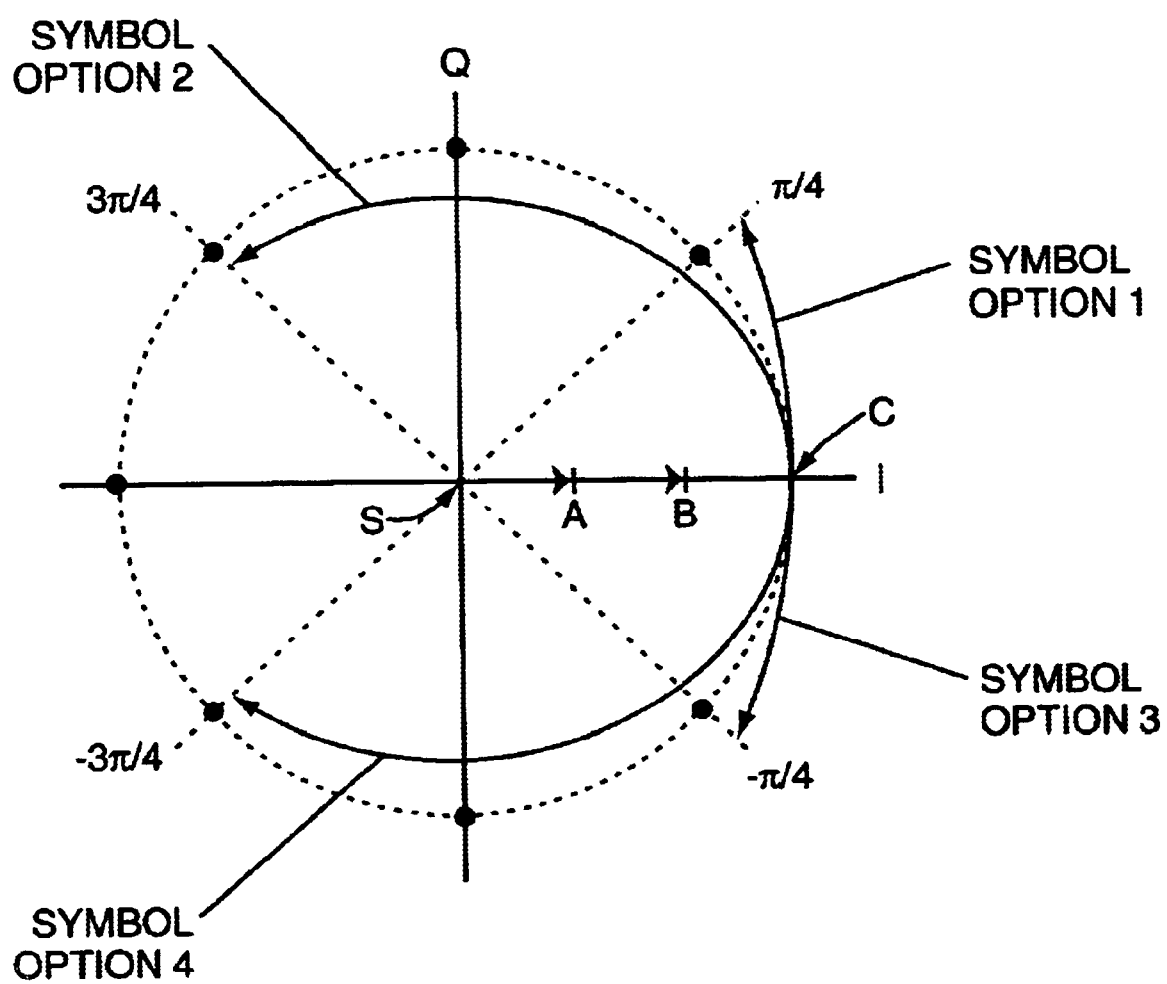
FIG. 4 is a I & Q phase constellation diagram of a DQPSK system of the prior art showing the possible combinations of start (S) ramp-up (A,B), reference symbol (C) and first message symbol transmission, showing four possible first symbol options.

One requirement on ANSI-136 systems is that a known symbol, called the reference symbol (C), be transmitted within three symbol periods of the start of the time slot (S). Thus, the transmit power needed at one particular instant in time is known a priori. However, the next symbol, i.e. the first message symbol, may take any one of four different values. As can be seen in FIG. 4, the transmit power undergoes a significant, and sudden, change in phase trajectory in moving from the ramp up symbols (A,B), through the reference symbol (C), and then on to the first message symbol. This sudden change in phase trajectory generates numerous higher-order harmonics in the transmit power. The result is that unacceptably high levels of transmit power may be generated in nearby frequencies. As such, the arrangement of the prior art has a tendency to generate unacceptable transient adjacent channel power.

Figure 5:
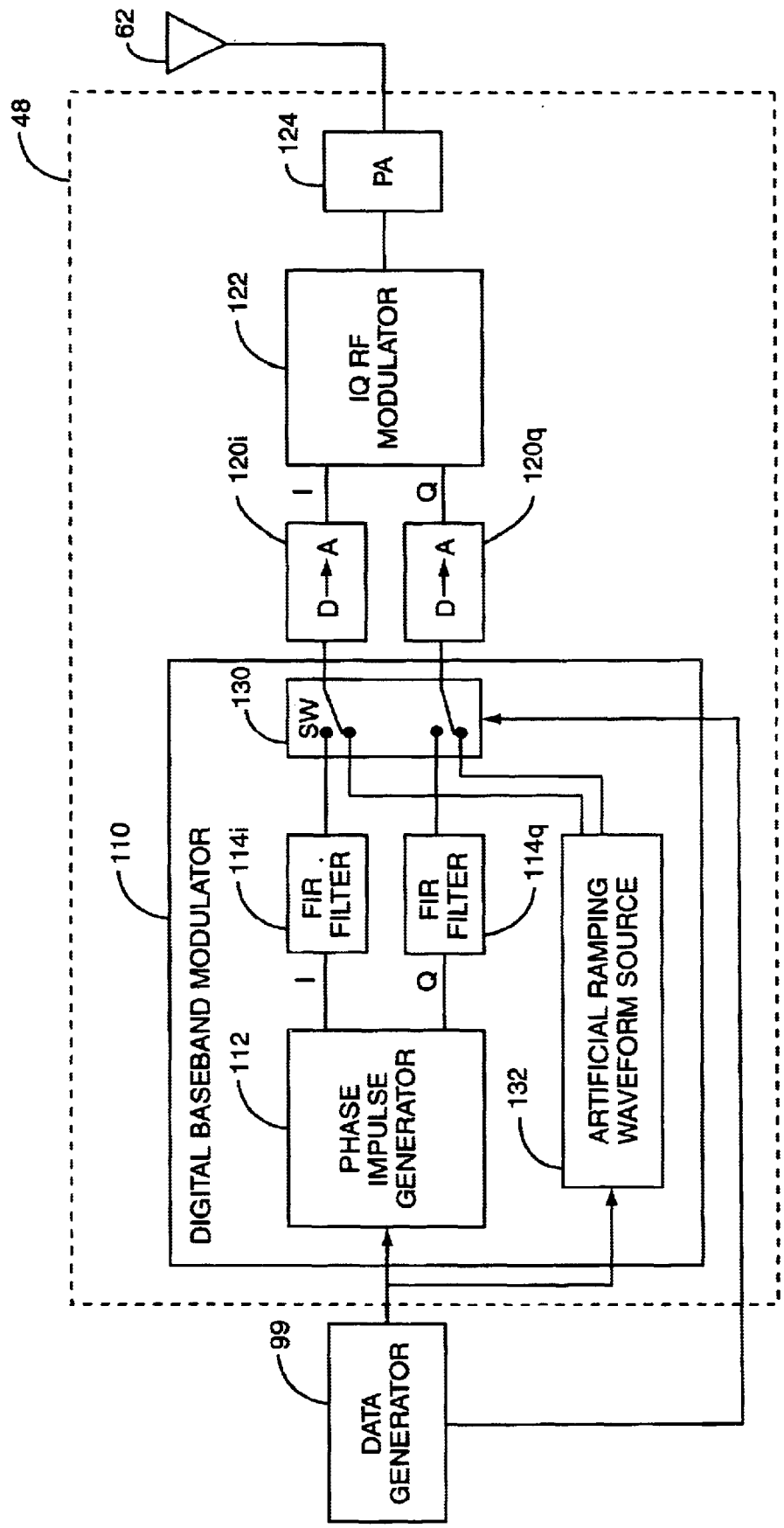
FIG. 5 is a schematic of one embodiment of a phase modulator and RF amplifier circuitry of the present invention.

To address this situation, the present invention artificially ramps the transmit power using an artificial ramping waveform profile which is selected based on at least the first message symbol to be transmitted. A switch 130 and an artificial ramping profile source 132 are added to the circuit of FIG. 2, to create the modified baseband modulator 110$b$ as shown in FIG. 5. The switch 130 operates to switch the input to the D/A converters 120$i$,120$q$ between the FIR filters 114$i$,114$q$ and the artificial ramping profile source 132. The artificial ramping profile source 132 is simply a storage device, such as ROM, flash memory, or the like, that has stored therein a plurality of predetermined artificial ramping waveform profiles. These artificial ramping profiles are provided to the D/A converters 120$i$,120$q$ in lieu of the outputs from the FIR filters 114$i$,114$q$ for a predetermined period of time at the start of the transmit time-slot. The switch 130 is used to change the input to the D/A converters 120$i$,120$q$ to the traditional waveform source of the phase impulse generator 112 and the FIR filters 114$i$,114$q$ at the conclusion of the ramping period.

To illustrate, just before the start (S) of the transmission time slot, the data generator 99 is assembling the message symbols that will be transmitted during the transmit time slot burst transmission. As such, the telephone 20 has a priori knowledge of at least the first portion of the message symbols before the burst transmission begins. For instance, assuming DQPSK modulation, the telephone 20 knows which of four symbols will be the first message symbol. At the start of the time slot, the data generator 99 forwards the message symbols to the phase impulse generator 112 in the traditional manner. While these symbols are processed and passed to the FIR filters 114$i$,114$q$, the filters 114$i$,114$q$ are not connected to downstream circuitry (e.g., the D/A converters 120$i$,120$q$, RF modulator 122, and power amplifier 124). Instead, the downstream circuitry is being fed inputs by the artificial ramping profile source 132. At the beginning of the time slot, the data generator 99, or some other portion of the telephone 20, informs the artificial ramping profile source 132 of the first message symbol. Based on which of the four possible symbols (in this illustrative example) is identified, the artificial ramping profile source 132 selects one of the artificial ramping profiles stored therein and outputs the selected artificial ramping profile to the downstream circuitry via switch 130. At or near the end of the ramping period, switch 130 changes the inputs to the traditional signal path, i.e., to the outputs from the FIR filters 114$i$,114$q$ which have been "normally" ramping up off-line. For best performance, the output from the artificial ramping profile source 132 should match that generated by the FIR filters 114$i$,114$q$ when switching the inputs to the D/A converters 120$i$,120$q$. In some embodiments, this switching is done at the time of the reference symbol (C). However, in order to minimize switching distortion during the reference symbol C, the switching may take place slightly before reference symbol C. Thus, in short, the transmitted signal preferably starts with the artificial ramping profile, followed by the reference symbol, followed by the beginning of the message symbol stream. Alternatively, the artificial ramping profile may include the reference symbol C.

Figure 6:
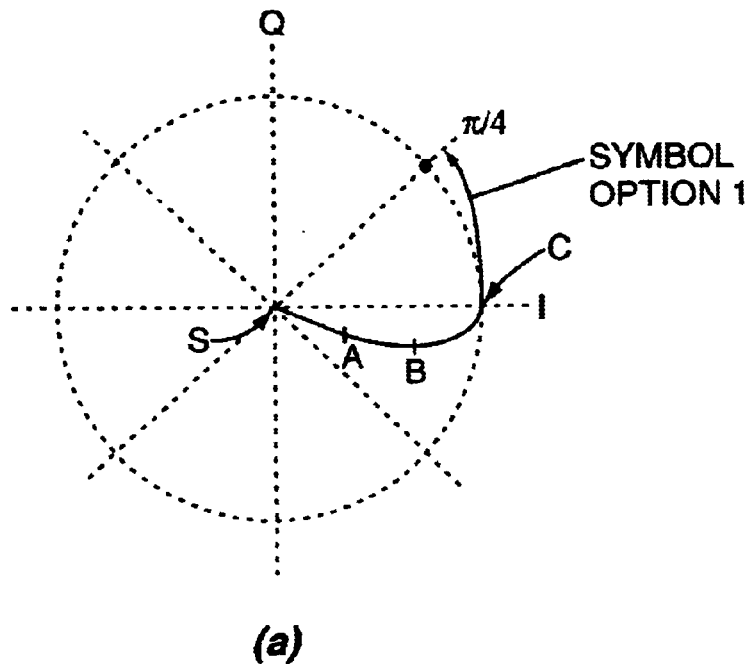
FIGS. 6A and B are I & Q phase constellation diagrams showing representative outputs of the transmit system of FIG. 5 having an artificially induced waveform during transmit power ramp-up.
Figure 6:
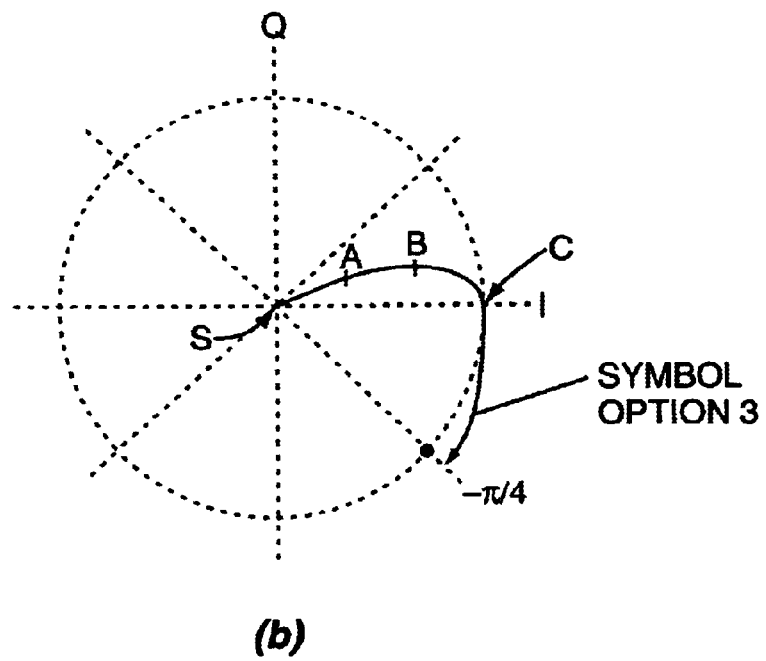

As mentioned above, there should be a plurality of artificial waveforms in the artificial ramping profile source 132. The particular details of each artificial ramping profile will depend on the particular components comprising the transmit circuitry, the linearity of the power amplifier 124, the modulation approach, and the like. However, the goal of each artificial ramping profile is to soften the sudden phase trajectory changes seen by the power amplifier 124 that generate the undesired harmonics. For instance, assuming a DQPSK modulation scheme, the phase may be artificially retarded or advanced during ramping as shown in FIGS. 6A and 6B. These phase constellation diagrams show a much smoother phase change at the reference symbol C than with the traditional approach of FIG. 4.

Because ramping profiles that are linear over substantially their entire length tend to cause discontinuities when moving from the reference symbol to the first message symbol, the artificial ramping profile is preferably non-linear at least near the point of switching, and more preferably non-linear for substantially their entire length.

As indicated above, one of a plurality of stored artificial ramping profiles is selected for use, depending on the first message symbol. Thus, if the first message symbol is Type X, then corresponding artificial ramping profile X is selected; if the first message symbol is Type Y, then artificial ramping profile Y is selected, and so forth. There should be at least two different artificial ramping profile available for selection, and preferably as many as there are possible first message symbols. Thus, while it is not required, each different possible first message symbol preferably has its own unique corresponding artificial ramping profile.

The artificial ramping profiles may be stored in any number of ways. For example, assume DQPSK, a three symbol ramp period, and a sampling rate of eight bytes per symbol. In such a scenario, the number of bytes necessary for each possible first message symbol would be 4×24×2, or four possible first symbols times twenty-four samples per ramp duration (eight per symbol times three symbols per ramp) times two (one for I and one for Q). Thus, a total of 192 bytes would be needed. Of course, other sampling rates, etc. could be used. The particular shape of the optimal artificial ramping profiles may be determined by using simulations of the transmit circuit responses; circuit response simulations being well known in the art.

In some embodiments, the particular artificial ramping profile selected by the artificial ramping profile source 132 is not based only on the first message symbol, but also on the next message symbol. For instance, burst messages having the same first message symbol, but different second message symbols, would use different artificial ramping profiles. However, to select the artificial ramping profile based on more the first and second message symbols obviously increases the number of pre-stored artificial ramping profiles needed, thereby increasing the storage space required by the artificial ramping profile source 132. In theory, the approach could be extended to include the impact of the third symbol, the fourth symbol, and so forth, but extension beyond two symbols is believed to have significantly reduced benefits at the cost of exponentially increasing storage.

The discussion above has assumed that the telephone was operating in an ANSI-136 TDMA system; however, the present invention is not limited to such systems. Instead, the present invention may be used in any burst transmission system, with particular applicability to terrestrial cellular and satellite cellular systems. As such, the references to the three symbol limitation for ramp-up and DQPSK modulation are for illustrative purposes only and are not limitations of the invention unless explicitly claimed.

By using the present invention, the generation of transient adjacent channel power may be significantly reduced. For instance, in an ANSI-136 system, the transient power transmitted in adjacent channels may be kept less then −26 dB relative to the power in the designated transmit channel. Likewise, the transient power transmitted in the alternate channels (i.e., next closest channels) may be kept less then −45 dB relative to the power in the designated transmit channel. All of this may be accomplished with reduced bias current in the power amplifier 124, thereby saving battery power, and without the additional circuit complexity associated with forced linear ramping.

The present invention may be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of burst transmitting a plurality of symbols, comprising:
   a) assembling a burst transmission message having at least a first message symbol;
   b) selecting one of a plurality of predetermined non-linear artificial ramping profiles based on the first message symbol of said burst transmission message;
   c) supplying said selected artificial ramping profile to an RF modulator and transmitting a burst transmission via said RF modulator based on said selected artificial ramping profile followed by said burst transmission message.

2. The method of claim 1 wherein said artificial ramping profile includes a plurality of ramping symbols.

3. The method of claim 1 wherein said burst transmission message further includes a second message symbol and wherein said selecting of said artificial ramping profile is based on at least the first and second message symbols.

4. The method of claim 1 wherein said transmitting includes transmitting a burst transmission via said RF modulator based on said selected artificial ramping profile followed by a reference symbol, followed by said burst transmission message.

5. The method of claim 1 wherein said artificial ramping profile includes I and Q components.

6. The method of claim 1 further including storing a plurality of predetermined non-linear artificial ramping profiles in a mobile unit in digital form prior to said selecting.

7. The method of claim 1 wherein said transmitting is according to ANSI-136.

8. A method of burst transmitting a plurality of symbols, comprising:
   assembling a burst transmission message having at least a first message symbol;
   selecting one of a plurality of predetermined non-linear artificial ramping profiles based on the first message symbol of said burst transmission message;
   supplying said selected artificial ramping profile to an RF modulator and transmitting a burst transmission via said RF modulator based on said selected artificial ramping profile followed by said burst transmission message; and
   wherein said artificial ramping profile includes a plurality of ramping symbols and wherein said artificial ramping profiles correspond to less than three symbol periods.

9. The method of claim 1 further including switching the input stream for said RF modulator from a source providing said selected artificial ramping profile to a source providing said burst transmission message during said transmitting.

10. A method of ramping burst transmission transmit power, comprising:
    storing a plurality of pre-determined artificial ramping profiles;
    assembling at least the initial portion of a burst transmission message, said initial portion having a plurality of message symbols including at least a sequentially first message symbol;
    selecting one of said plurality of stored ramping profiles based on the characteristics of said first message symbol;
    supplying said selected ramping profile to an RF power amplifier during a ramping period via a first signal path, said selected ramping profile being at least partially non-linear;
    after said ramping period, supplying said RF power amplifier with said message symbols of said initial portion via a second signal path;
    transmitting the signals conditioned by said RF power amplifier in response to said artificial ramping profile and said message symbols during a burst transmission.

11. The method of claim 10 wherein said plurality of message symbols includes a second message symbol and wherein said artificial ramping profile supplied to said RF power amplifier further depends on the characteristics of said second message symbol.

12. The method of claim 10 wherein said supplied artificial ramping profile is non-linear over substantially its entire duration.

13. The method of claim 10 wherein said artificial ramping profile includes a predetermined reference symbol.

14. The method of claim 10 further including supplying a predetermined reference symbol to said RF power amplifier between said artificial ramping profile and said message symbols.

15. The method of claim 10 wherein a wireless communications mobile terminal performs said transmitting and said storing, and wherein said storing by said mobile terminal occurs prior to said assembling.

16. The method of claim 15 wherein said transmitting is according to ANSI-136.

17. The method of claim 10 wherein said first signal path includes an artificial ramping profile source and a switch.

18. A method of ramping burst transmission transmit power, comprising:
    assembling at least the initial portion of a burst transmission message, said initial portion having a plurality of message symbols including at least a sequentially first message symbol;
    supplying an artificial ramping profile to an RF power amplifier during a ramping period via a first signal path, said artificial ramping profile being at least partially non-linear;
    after said ramping period, supplying said RF power amplifier with said message symbols of said initial portion via a second signal path;

transmitting the signals conditioned by said RF power amplifier in response to said artificial ramping profile and said message symbols during a burst transmission;

wherein said first signal path includes an artificial ramping profile source and a switch; and wherein said second signal path includes a phase impulse modulator, at least one finite impulse response filter, and said switch in sequence.

19. A method of ramping burst transmission transmit power, comprising:

assembling at least the initial portion of a burst transmission message, said initial portion having a plurality of message symbols including at least a sequentially first message symbol;

supplying an artificial ramping profile to an RF power amplifier during a ramping period via a first signal path, said artificial ramping profile being at least partially non-linear;

after said ramping period, supplying said RF power amplifier with said message symbols of said initial portion via a second signal path;

transmitting the signals conditioned by said RF power amplifier in response to said artificial ramping profile and said message symbols during a burst transmission;

wherein said first signal path includes an artificial ramping profile source having stored therein a plurality of artificial ramping power profiles and wherein said artificial ramping profile supplied to said RF power amplifier is selected from said stored artificial ramping power profiles; and wherein said assembling includes notifying said artificial ramping profile source of the identity of said first message symbol.

20. The method of claim 1 wherein said selecting is performed by an artificial ramping profile source and wherein said assembling comprises notifying said artificial ramping profile source of the identity of said first message symbol.

* * * * *